(12) United States Patent
Chai et al.

(10) Patent No.: US 10,629,277 B2
(45) Date of Patent: Apr. 21, 2020

(54) SIGNAL GENERATION CIRCUIT AND SEMICONDUCTOR MEMORY DEVICE INCLUDING THE SAME

(71) Applicant: SK hynix Inc., Gyeonggi-do (KR)

(72) Inventors: Seung Wan Chai, Seoul (KR); Young Sub Yuk, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/117,470

(22) Filed: Aug. 30, 2018

(65) Prior Publication Data
US 2019/0221275 A1 Jul. 18, 2019

(30) Foreign Application Priority Data
Jan. 16, 2018 (KR) .................. 10-2018-0005549

(51) Int. Cl.
| | | |
|---|---|---|
| *G11C 16/26* | (2006.01) | |
| *G11C 16/34* | (2006.01) | |
| *G11C 16/10* | (2006.01) | |
| *G11C 16/04* | (2006.01) | |
| *G11C 7/22* | (2006.01) | |
| *G11C 7/10* | (2006.01) | |

(52) U.S. Cl.
CPC ........... *G11C 16/3459* (2013.01); *G11C 7/22* (2013.01); *G11C 16/0483* (2013.01); *G11C 16/10* (2013.01); *G11C 16/26* (2013.01); *G11C 7/1084* (2013.01); *G11C 2216/14* (2013.01)

(58) Field of Classification Search
CPC .. G11C 16/3459; G11C 16/26; G11C 16/0483
See application file for complete search history.

(56) References Cited

U.S. PATENT DOCUMENTS

| 6,292,406 | B1* | 9/2001 | Le | G11C 8/08 |
| | | | | 365/189.09 |
| 2002/0041193 | A1* | 4/2002 | Tamura | H04L 5/1423 |
| | | | | 326/86 |
| 2014/0300399 | A1* | 10/2014 | Miyake | G09G 3/3677 |
| | | | | 327/296 |
| 2017/0256293 | A1 | 9/2017 | Yuk | |

FOREIGN PATENT DOCUMENTS

| KR | 100466981 | 1/2005 |
| KR | 101133590 | 4/2012 |
| KR | 1020170104297 | 9/2017 |

* cited by examiner

*Primary Examiner* — Huan Hoang
*Assistant Examiner* — Jay W. Radke
(74) *Attorney, Agent, or Firm* — IP & T Group LLP

(57) ABSTRACT

There are provided a signal generation circuit and a semiconductor memory device including the same. The signal generation circuit includes: a signal input component configured to generate a first internal output signal and a second internal output signal in response to an input signal, and to adjust potential levels of the first internal output signal and the second internal output signal in response to an output signal; and a signal output component configured to generate the output signal in response to the first internal output signal and the second internal output signal.

19 Claims, 10 Drawing Sheets

US 10,629,277 B2

1

SIGNAL GENERATION CIRCUIT AND SEMICONDUCTOR MEMORY DEVICE INCLUDING THE SAME

CROSS-REFERENCE TO RELATED APPLICATION

The present application claims priority under 35 U.S.C. § 119(a) to Korean patent application number 10-2018-0005549, filed on Jan. 16, 2018, the entire disclosure of which is incorporated herein by reference.

BACKGROUND

Field of Invention

Various embodiments of the present disclosure generally relate to an electronic device. Particularly, the embodiments relate to a signal generation circuit and semiconductor memory device including the same.

Description of Related Art

A semiconductor memory device is a storage device implemented using a semiconductor such as silicon (Si), germanium (Ge), gallium arsenide (GaAs), or indium phosphide (InP). The semiconductor memory device is generally classified into a volatile memory device and a nonvolatile memory device.

The volatile memory device loses stored data when the power supply is cut off. Examples of the volatile memory include a static random access memory (SRAM), a dynamic RAM (DRAM), a synchronous DRAM (SDRAM), and the like. The nonvolatile memory device retains stored data even when the power supply is cut off. Examples of the nonvolatile memory include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. The flash memory is generally classified into a NOR type flash memory and a NAND type flash memory.

SUMMARY

Embodiments provide a signal generation circuit configured to output an output signal by stably controlling the potential level of the output signal, and a semiconductor memory device including the signal generation circuit.

According to an aspect of the present disclosure, there is provided a signal generation circuit including: a signal input component configured to generate a first internal output signal and a second internal output signal in response to an input signal, and to adjust potential levels of the first internal output signal and the second internal output signal in response to an output signal; and a signal output component configured to generate the output signal in response to the first internal output signal and the second internal output signal.

According to another aspect of the present disclosure, there is provided a semiconductor memory device including: a memory cell array including a plurality of memory cells; a page buffer group coupled to a plurality of bit lines of the memory cell array, configured to sense potential levels or current levels of the plurality of bit lines in response to a sensing signal in a program verify operation and a read operation on the memory cell array; and a signal generation circuit configured to generate the sensing signal in the program verify operation and the read operation, wherein the signal generation circuit includes: a signal input component configured to generate a first internal output signal and a second internal output signal in response to an input signal, and to adjust potential levels of the first internal output signal and the second internal output signal in response to an output signal; and a signal output component configured to generate the output signal in response to the first internal output signal and the second internal output signal.

BRIEF DESCRIPTION OF THE DRAWINGS

Various embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art. It is noted that reference to "an embodiment" does not necessarily mean only one embodiment, and different references to "an embodiment" are not necessarily to the same embodiment(s).

In the drawings, dimensions of the figures may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 1:
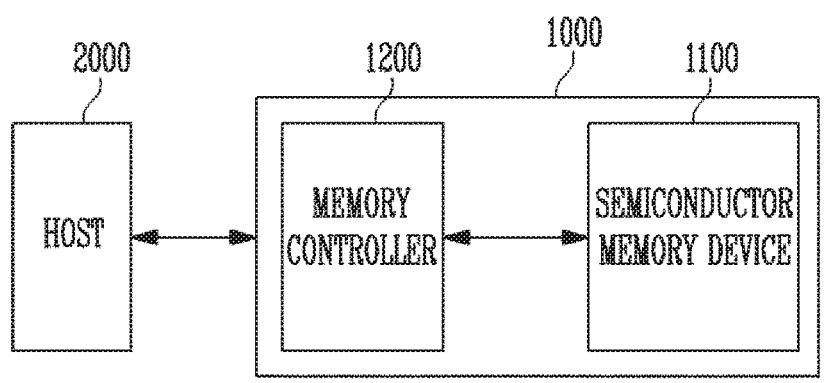
FIG. 1 is a diagram illustrating a memory system according to an embodiment of the present disclosure.

FIG. 1 is a diagram illustrating a memory system 1000 according to an embodiment of the present disclosure.

Referring to FIG. 1, the memory system 1000 may include a semiconductor memory device 1100 for storing data and a memory controller 1200 for controlling the semiconductor memory device 1100 under the control of a host 2000.

The host 2000 may communicate with the memory system 1000 by using an interface protocol such as Peripheral Component Interconnect-Express (PCI-E), Advanced Technology Attachment (ATA), Serial ATA (SATA), Parallel ATA (PATA), or Serial Attached SCSI (SAS). Interface protocols between the host 2000 and the memory system 1000 are not limited to the above-described examples, and may be one of other interface protocols such as a Universal Serial Bus (USB), a Multi-Media Card (MMC), an Enhanced Small Disk Interface (ESDI), and Integrated Drive Electronics (IDE).

The memory controller 1200 may control the overall operations of the memory system 1000, and control data exchange between the host 2000 and the semiconductor memory device 1100. For example, the memory controller 1200 may program or read data by controlling the semiconductor memory device 1100 in response to a request from the host 2000. Depending on an embodiment, the semiconductor memory device 1100 may include, for example, a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), and a flash memory.

The semiconductor memory device 1100 may perform a program, read or erase operation under the control of the memory controller 1200.

Figure 2:
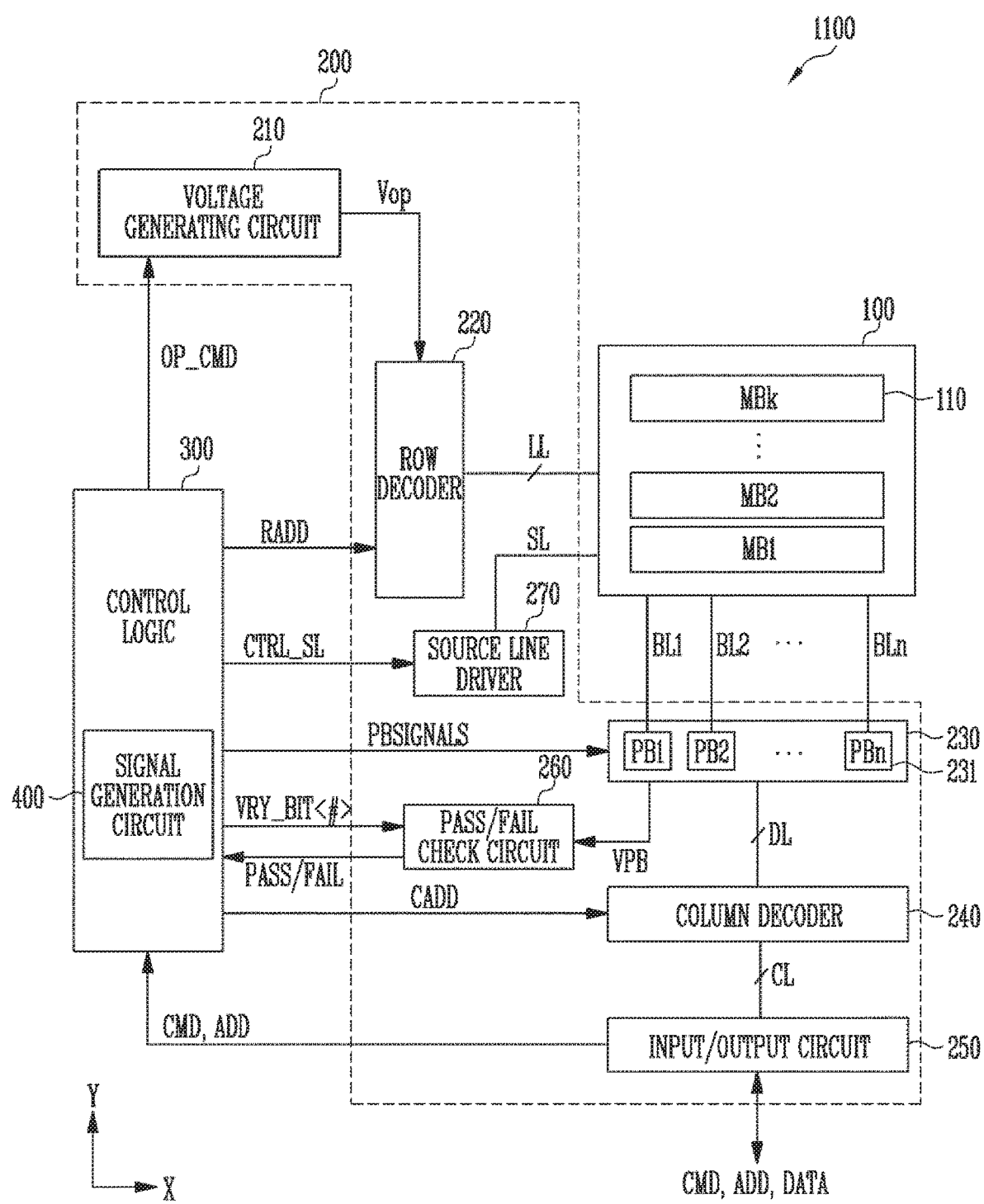
FIG. 2 is a diagram illustrating a memory device according to an embodiment of the present disclosure.

FIG. 2 is a diagram illustrating a memory device according to an embodiment of the present disclosure, for example, the semiconductor memory device 1100 of FIG. 1.

Referring to FIG. 2, the semiconductor memory device 1100 may include a memory cell array 100 that stores data. The semiconductor memory device 1100 may include a peripheral circuit 200 configured to perform a program operation for storing data in the memory cell array 100, a read operation for outputting the stored data, and an erase operation for erasing the stored data. The semiconductor memory device 1100 may include a control logic 300 that controls the peripheral circuit 200 under the control of the memory controller 1200 of FIG. 1.

The memory cell array 100 may include a plurality of memory blocks MB1 to MBk (where k is a positive integer) 110. Local lines LL and bit lines BL1 to BLn (where n is a positive integer) may be coupled to the memory blocks MB1 to MBk 110. For example, the local lines LL may include a first select line, a second select line, and a plurality of word lines arranged between the first and second select lines. Also, the local lines LL may further include dummy lines arranged between the first select line and the word lines and between the second select line and the word lines. The first select line may be a source select line, and the second select line may be a drain select line. For example, the local lines LL may include word lines, drain and source select lines, and source lines SL. For example, the local lines LL may further include dummy lines. For example, the local lines LL may further include pipe lines. The local lines LL may be coupled to the memory blocks MB1 to MBk 110, respectively, and the bit lines BL1 to BLn may be commonly coupled to the memory blocks MB1 to MBk 110. The memory blocks MB1 to MBk 110 may be implemented in a two-dimensional or three-dimensional structure. For example, memory cells may be arranged in a direction parallel to a substrate in memory blocks 110 having a two-dimensional structure. For example, memory cells may be arranged in a direction vertical to a substrate in memory blocks 110 having a three-dimensional structure.

The peripheral circuit 200 may be configured to perform program, read, and erase operations of a selected memory block 110 under the control of the control logic 300. For example, the peripheral circuit 200, under the control of the control logic 300, may supply verify and pass voltages to the first select line, the second select line, and the word lines, selectively discharge the first select line, the second select line, and the word lines, and verify memory cells coupled a selected word line among the word lines. For example, the peripheral circuit 200 may include a voltage generating circuit 210, a row decoder 220, a page buffer group 230, a column decoder 240, an input/output circuit 250, a pass/fail check circuit 260, and a source line driver 270.

The voltage generating circuit 210 may generate various operating voltages Vop used for program, read, and erase operations in response to an operation signal OP_CMD. Also, the voltage generating circuit 210 may selectively discharge the local lines LL in response to the operation signal OP_CMD. For example, the voltage generating circuit 210 may generate a program voltage, a verify voltage, pass voltages, a read voltage, a source line voltage, and the like under the control of the control logic 300.

The row decoder 220 may transfer the operating voltages Vop to local lines LL coupled to a selected memory block 110 in response to a row address RADD.

The page buffer group 230 may include a plurality of page buffers PB1 to PBn 231 coupled to the bit lines BL1 to BLn. The page buffers PB1 to PBn 231 may operate in response to page buffer control signals PBSIGNALS. For example, the page buffers PB1 to PBn 231 may temporarily store data received through the bit lines BL1 to BLn, or sense voltages or current of the bit lines BL1 to BLn in a read or verify operation. Also, the page buffers PB1 to PBn 231 may sense at least three program states, using a difference in cell current according to a program state of memory cells while one read voltage is being applied to a selected local line among the local lines LL in the read operation.

The column decoder 240 may transfer data between the input/output circuit 250 and the page buffer group 230 in response to a column address CADD. For example, the column decoder 240 may exchange data with the page buffers 231 through data lines DL, or exchange data with the input/output circuit 250 through column lines CL.

The input/output circuit 250 may transfer a command CMD and an address ADD, which are received from the memory controller 1200 of FIG. 1, to the control logic 300, or exchange data DATA with the column decoder 240.

In a read operation and a verify operation, the pass/fail check circuit 260 may generate a reference current in response to a permission bit VRY_BIT<#>, and output a pass signal PASS or a fail signal FAIL by comparing a sensing voltage VPB received from the page buffer group 230 with a reference voltage generated by the reference current.

The source line driver 270 may be coupled to a memory cell included in the memory cell array 100 through a source line SL, and control the voltage of a source node of the memory cell. As an example, in a read or verify operation, the source line driver 270 may electrically couple a source node of the memory cell to a ground node. Also, in a program operation, the source line driver 270 may apply a ground voltage to the source node of the memory cell. In an erase operation, the source line driver 270 may apply an erase voltage to the source node of the memory cell. The source line driver 270 may receive a source line control signal CTRL_SL from the control logic 300, and control the voltage of the source node, based on the source line control signal CTRL_SL.

The control logic 300 may control the peripheral circuit 200 by outputting the operation signal OP_CMD, the row address RADD, the page buffer control signals PBSIGNALS, and the permission bit VRY_BIT<#> in response to the command CMD and the address ADD. Also, the control logic 300 may determine whether the verify operation has passed or failed in response to the pass or fail signal PASS or FAIL.

The control logic 300 may include a signal generation circuit 400. The signal generation circuit 400 may generate and output some signals among the page buffer control signals PBSIGNALS. For example, the signal generation circuit 400 may generate and output signals for allowing the plurality of page buffers PB1 to PBn 231 to sense potentials or current levels of the corresponding bit lines BL1 to BLn.

Figure 3:
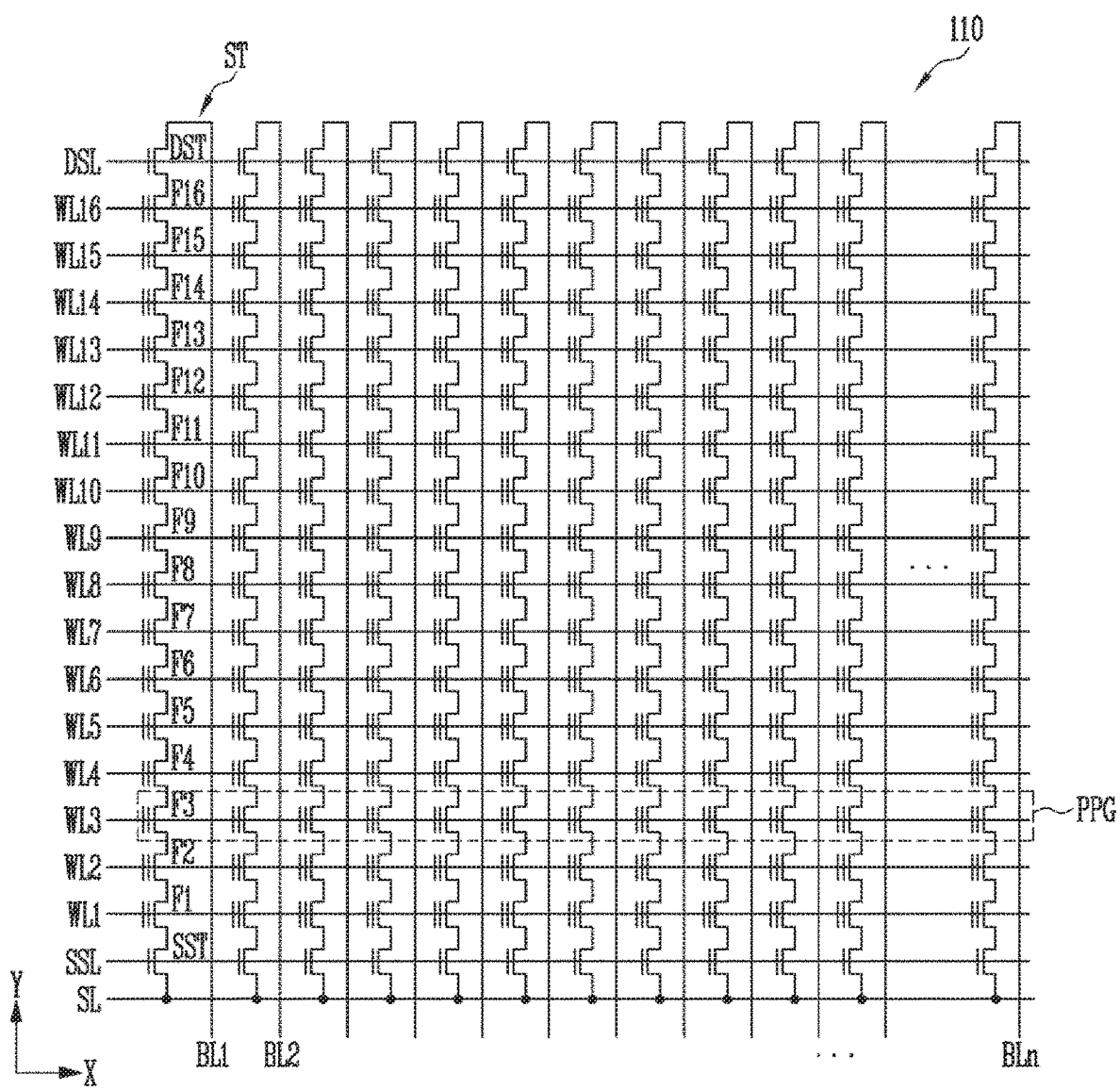
FIG. 3 is a diagram illustrating a memory block according to an embodiment of the present disclosure.

FIG. 3 is a diagram illustrating a memory block according to an embodiment of the present disclosure, for example, the memory block 110 of FIG. 2.

Referring to FIG. 3, in the memory block 110, a plurality of word lines arranged in parallel to one another may be coupled between a first select line and a second select line. The first select line may be a source select line SSL, and the second select line may be a drain select line DSL. More specifically, the memory block 110 may include a plurality of strings ST coupled between bit lines BL1 to BLn and a source line SL. The bit lines BL1 to BLn may be coupled to the strings ST, respectively, and the source line SL may be commonly coupled to the strings ST. The strings ST may be configured identically to one another, and therefore, a string ST coupled to a first bit line BL1 will be described in detail as an example.

The string ST may include a source select transistor SST, a plurality of memory cells F1 to F16, and a drain select transistor DST, which are coupled in series to each other between the source line SL and the first bit line BL1. At least one source select transistor SST and at least one drain select transistor DST may be included in one string ST, and the number of memory cells included in one string ST may be greater than that of the memory cells F1 to F16 shown in the drawings.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of source select transistors SST included in different strings ST may be coupled to the source select line SSL, gates of drain select transistors DST included in different strings ST may be coupled to the drain select line DSL, gates of the memory cells F1 to F16 included in different strings ST may be coupled to a plurality of word lines WL1 to WL16. A group of memory cells coupled to the same word line among the memory cells included in different strings ST may be a physical page PPG. Therefore, physical pages PPG of which number corresponds to that of the word lines WL1 to WL16 may be included in the memory block 110.

One memory cell may store data of one bit. This is generally called as a single level cell (SLC). One physical page PPG may store one logical page (LPG) data. The one LPG data may include data bits of which number corresponds to that of cells included in one physical page PPG. In addition, one memory cell may store data of two or more bits. This is generally called as a multi-level cell. One physical page PPG may store two or more LPG data.

Figure 4:
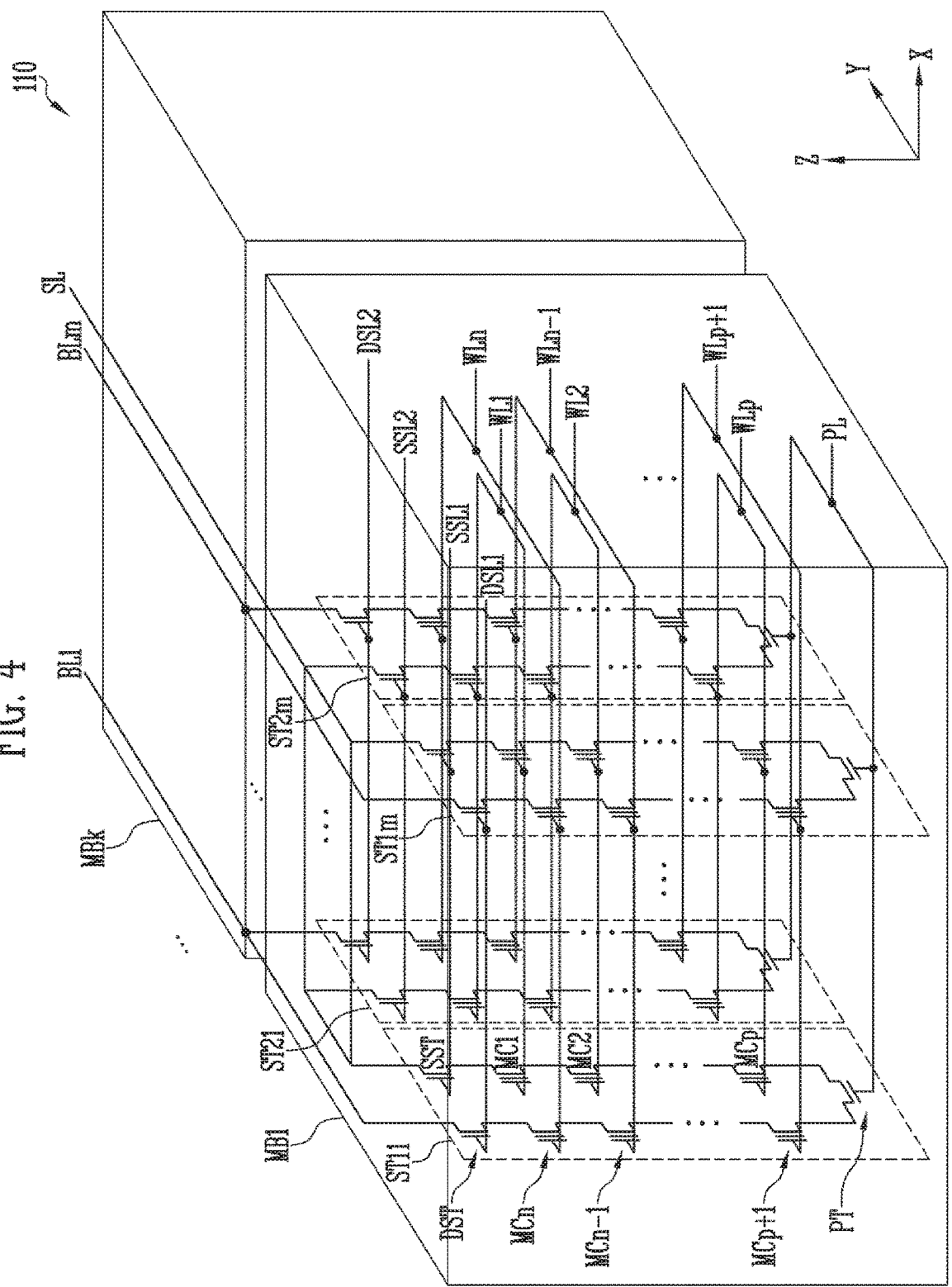
FIG. 4 is a diagram illustrating an embodiment of a three-dimensionally configured memory block.

FIG. 4 is a diagram illustrating an embodiment of a three-dimensionally configured memory block.

Referring to FIG. 4, the memory cell array 100 of FIG. 2 may include a plurality of memory blocks MB1 to MBk 110. The memory block 110 may include a plurality of strings ST11 to ST1$m$ and ST21 to ST2$m$. In an embodiment, each of the plurality of strings ST11 to ST1$m$ and ST21 to ST2$m$ may be formed in a 'U' shape. In the memory block 110, m strings may be arranged in a row direction (i.e., X direction). Although FIG. 4 illustrates that two strings are arranged in a column direction (i.e., Y direction), this is for convenience, and three or more strings may be arranged in the column direction (i.e., Y direction).

Each of the plurality of strings ST11 to ST1$m$ and ST21 to ST2$m$ may include at least one source select transistor SST, first to nth memory cells MC1 to MCn, a pipe transistor PT, and at least one drain select transistor DST.

The source and drain select transistors SST and DST and the memory cells MC1 to MCn may have structures similar to one another. For example, each of the source and drain select transistors SST and DST and the memory cells MC1 to MCn may include a channel layer, a tunnel insulating layer, a charge trapping layer, and a blocking insulating layer. For example, a pillar for providing the channel layer may be provided in each string. For example, a pillar for providing at least one of the channel layer, the tunnel insulating layer, the charge trapping layer, and the blocking insulating layer may be provided in each string.

The source select transistor SST of each string may be coupled between a source line SL and memory cells MC1 to MCp.

In an embodiment, source select transistors of strings arranged in the same row may be coupled to a source select line extending in the row direction, and source select transistors of strings arranged in different rows may be coupled to different source select lines. In FIG. 4, source select transistors of strings ST11 to ST1$m$ of a first row may be coupled to a first source select line SSL1. Source select transistors of strings ST21 to ST2$m$ of a second row may be coupled to a second source select line SSL2.

In another embodiment, the source select transistors of the strings ST11 to ST1$m$ and ST21 to ST2$m$ may be commonly coupled to one source select line.

First to nth memory cells MC1 to MCn of each string may be coupled between the source select transistor SST and the drain select transistor DST.

The first to nth memory cells MC1 to MCn may be divided into first to pth memory cells MC1 to MCp and (p+1)th to nth memory cells MCp+1 to MCn. The first to pth memory cells MC1 to MCp may be sequentially arranged in a vertical direction (i.e., Z direction), and be coupled in series to each other between the source select transistor SST and the pipe transistor PT. The (p+1)th to nth memory cells MCp+1 to MCn may be sequentially arranged in the vertical direction (i.e., Z direction), and be coupled in series to each other between the pipe transistor PT and the drain select transistor DST. The first to pth memory cells MC1 to MCp and the (p+1)th to nth memory cells MCp+1 to MCn may be coupled to each other through the pipe transistor PT. Gates of the first to nth memory cells MC1 to MCn of each string may be coupled to first to nth word lines WL1 to WLn, respectively.

In an embodiment, at least one of the first to nth memory cells MC1 to MCn may be used as a dummy memory cell. When a dummy memory cell is provided, the voltage or current of a corresponding string can be stably controlled. A gate of the pipe transistor PT of each string may be coupled to a pipe line PL.

The drain select transistor DST of each string may be coupled to a bit line and the memory cells MCp+1 to MCn. Strings arranged in the row direction may be coupled to a drain select line extending in the row direction. Drain select transistors of the strings ST11 to ST1, of the first row may be coupled to a first drain select line DSL1. Drain select transistors of the strings ST21 to ST2m of the second row may be coupled to a second drain select line DSL2.

Strings arranged in the column direction may be coupled to bit lines extending in the column direction. In FIG. 4, strings ST11 and ST21 of a first column may be coupled to a first bit line BL1. Strings ST1m and ST2m of an mth column may be coupled to an nth bit line BLn.

Memory cells coupled to the same word line among the strings arranged in the row direction may constitute one page. For example, memory cells coupled to the first word line WL1 among the strings ST11 to ST1m of the first row may constitute one page. Memory cells coupled to the first word line WL1 among the strings ST21 to ST2m of the second row may constitute another page. When any one of the drain select lines DSL1 and DSL2 is selected, strings arranged in one row direction may be selected. When any one of the word lines WL1 to WLn is selected, one page among the selected strings may be selected.

Figure 5:
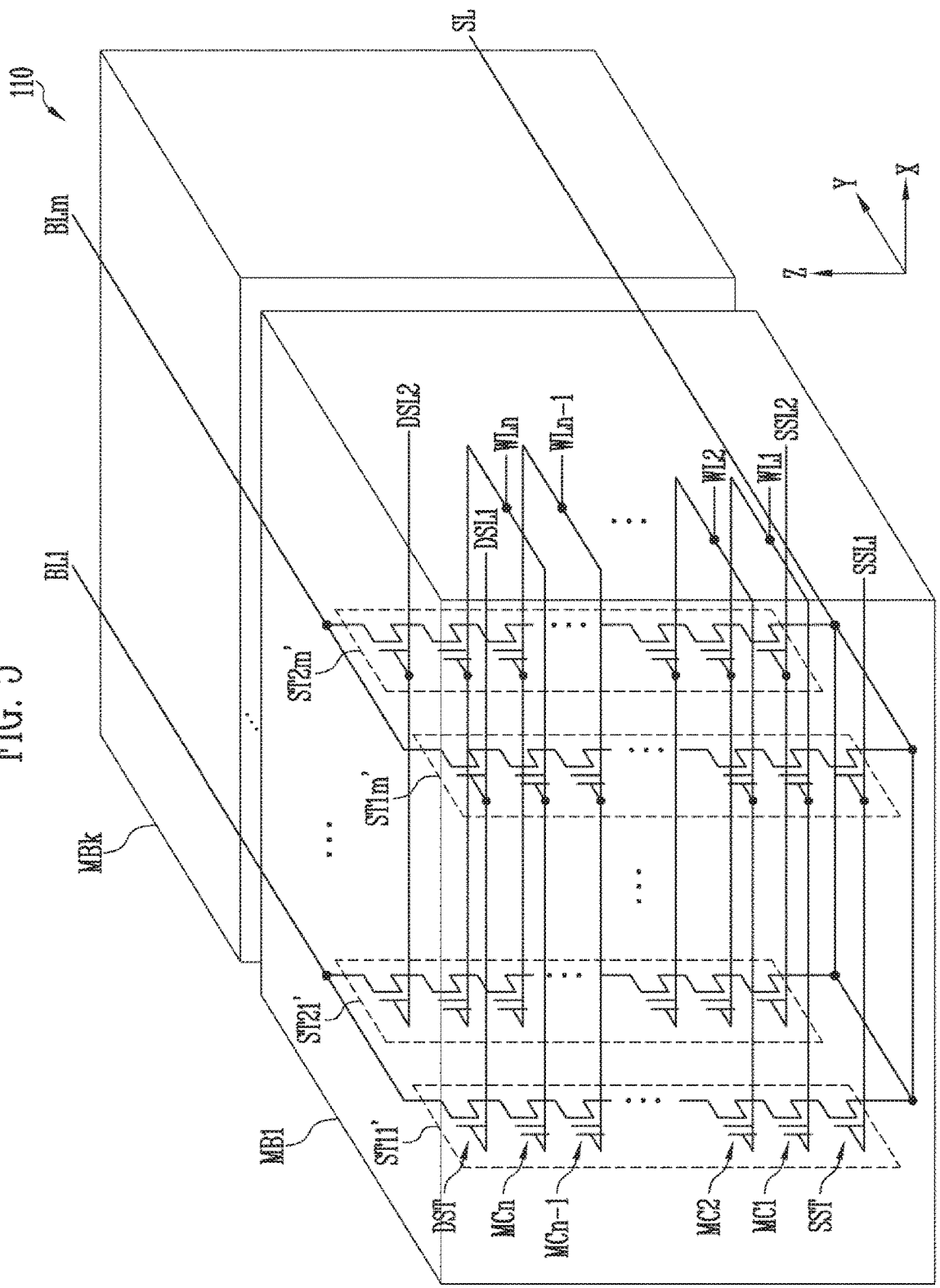
FIG. 5 is a diagram illustrating another embodiment of the three-dimensionally configured memory block.

FIG. 5 is a diagram illustrating another embodiment of the three-dimensionally configured memory block.

Referring to FIG. 5, the memory cell array 100 of FIG. 2 may include a plurality of memory blocks MB1 to MBk 110. The memory block 110 may include a plurality of strings ST11' to ST1m' and ST21' to ST2m'. Each of the plurality of strings ST11' to ST1m' and ST21' to ST2m' may extend along a vertical direction (i.e., Z direction). In the memory block 110, m strings may be arranged in a row direction (i.e., X direction). Although FIG. 5 illustrates that two strings are arranged in a column direction (i.e., Y direction), this is for convenience, and three or more strings may be arranged in the column direction (i.e., Y direction).

Each of the plurality of strings ST11' to ST1m' and ST21' to ST2m' may include at least one source select transistor SST, first to nth memory cells MC1 to MCn, and at least one drain select transistor DST.

The source select transistor SST of each string may be coupled between a source line SL and the memory cells MC1 to MCn. Source select transistors of strings arranged in the same row may be coupled to the same source select line. Source select transistors of strings ST11' to ST1m' arranged on a first row may be coupled to a first source select line SSL1. Source select transistors of strings ST21' to ST2m' arranged on a second row may be coupled to a second source select line SSL2. In another embodiment, the source select transistors of the strings ST11' to ST1m' and ST21' to ST2m' may be commonly coupled to one source select line.

The first to nth memory cells MC1 to MCn of each string may be coupled in series to each other between the source select transistor SST and the drain select transistor DST. Gates of the first to nth memory cells MC1 to MCn may be coupled to first to nth word lines WL1 to WLn, respectively.

In an embodiment, at least one of the first to nth memory cells MC1 to MCn may be used as a dummy memory cell. When a dummy memory cell is provided, the voltage or current of a corresponding string can be stably controlled. Accordingly, the reliability of data stored in the memory block 110 can be improved.

The drain select transistor DST of each string may be coupled between a bit line and the memory cells MC1 to MCn. Drain select transistors DST of strings arranged in the row direction may be coupled to a drain select line extending in the row direction. The drain select transistors DST of the strings ST11' to ST1m' of the first row may be coupled to a first drain select line DSL1. The drain select transistors DST of the strings ST21' to ST2m' of the second row may be coupled to a second drain select line DSL2.

Therefore, the memory block 110 of FIG. 5 may have a circuit substantially similar to that of the memory block 110 of FIG. 4. That is, the memory block 110 of FIG. 5 excludes the pipe transistor PT from each string that is included in the memory block 110 of FIG. 4.

Figure 6:
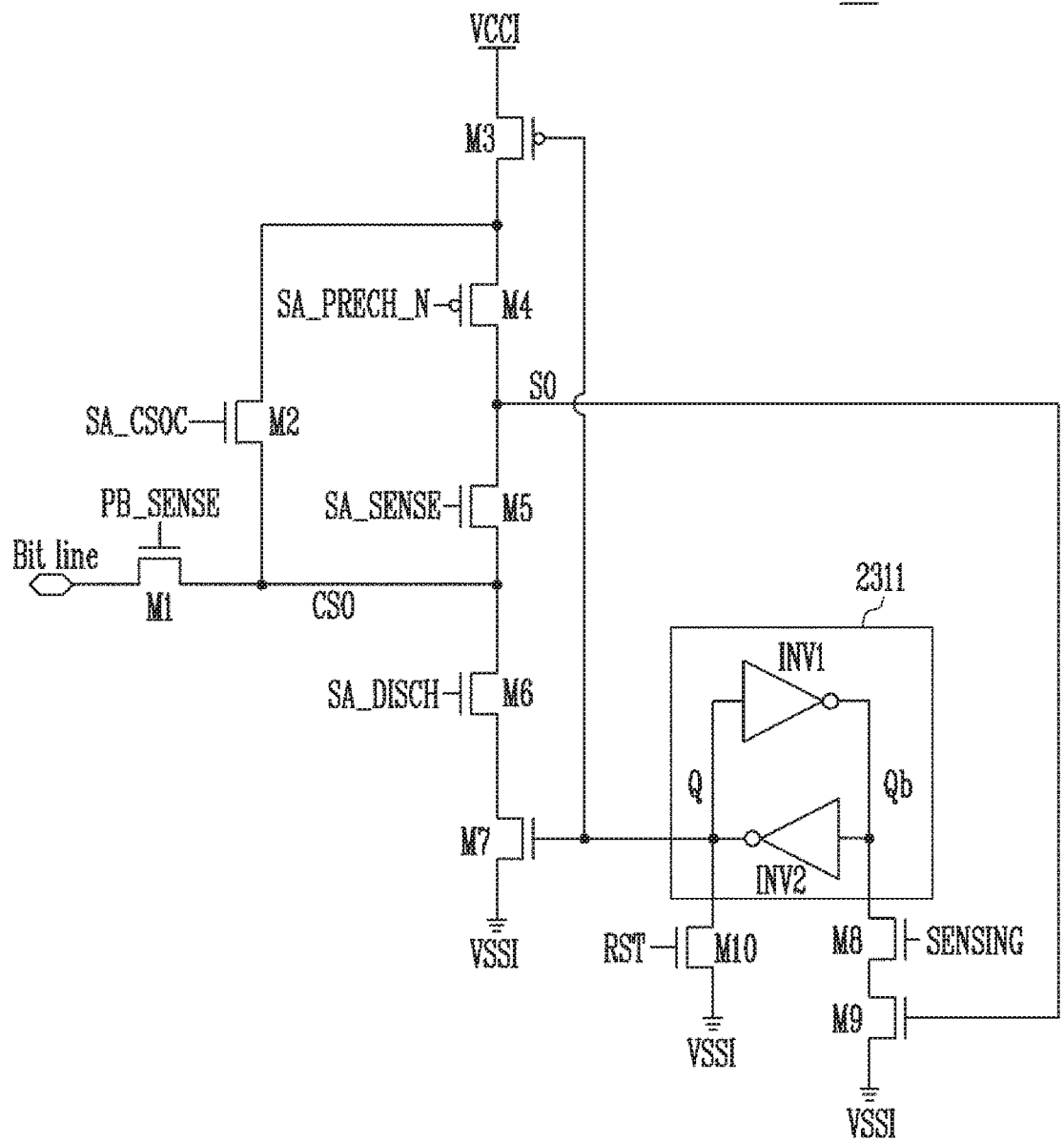
FIG. 6 is a diagram illustrating a page buffer according to an embodiment of the present disclosure.

FIG. 6 is a diagram illustrating a page buffer according to an embodiment of the present disclosure, for example, the page buffer 231 of FIG. 2.

Referring to FIG. 6, the page buffer 231 is coupled to memory cells MC through a bit line Bit line, and may perform a bit line precharge operation of charging charges supplied from a power voltage VCCI through first to fifth transistors M1 to M5 to the bit line Bit line. The first transistor M1 is controlled by a first sense signal PB_SENSE. The second transistor M2 is controlled by a first precharge signal SA_CSOC. The third transistor M3 is controlled by a storage 2311. The fourth transistor M4 is controlled by a second precharge signal SA_PRECH_N. The fifth transistor M5 is controlled by a second sense signal SA_SENSE. The storage 2311 may be configured as a latch or fuse.

Also, the page buffer 231 may discharge, to a ground voltage VSSI, charges charged to the bit line Bit line through the first transistor M1, a sixth transistor M6, and a seventh transistor M7. The sixth transistor M6 is controlled by a first discharge signal SA_DISCH, and the seventh transistor M7 is controlled by the storage 2311.

The page buffer 231 may include the storage 2311 including a first inverter INV1 and a second inverter INV2. The storage 2311 may control the bit line precharge operation by turning on or turning off the third transistor M3 through a first node Q. A second node Qb and the first node Q have values reversed from each other. The voltage of a sense node S0 during a sensing operation on the memory cell MC is determined based on a threshold voltage of the memory cell MC. For example, the voltage of the bit line Bit line may be determined based on the threshold voltage of the memory cell MC. When the first and fifth transistors M1 and M5 are turned on, the bit line Bit line and the sense node S0 are coupled to each other through a common node CS0, and hence the voltage of the sense node S0 may be determined based on the threshold voltage of the memory cell MC. The storage 2311 may store a result obtained by sensing the threshold voltage of the memory cell MC through an eighth transistor M8 and a ninth transistor M9, which are coupled between the second node Qb and the ground voltage VSSI. The eighth transistor M8 may be turned on according to a sensing signal SENSING applied at a high level in the sensing operation. The second node Qb may maintain the high level that is an initial state or be changed to a low level according to the ninth transistor M9 turned on or turned off based on a potential level of the sense node S0, to latch data corresponding to the potential level of the sense node S0. When the threshold voltage of the memory cell MC is low, the potential level of the sense node S0 during the sensing operation may be the low level, and the ninth transistor M9 may be turned off. When the threshold voltage of the memory cell MC is high, the potential level of the sense node S0 during the sensing operation may be the high level, and the ninth transistor M9 may be turned on. A tenth transistor M10 is controlled by a reset signal RST, to initialize the first node Q to the potential level of the ground voltage VSSI.

The above-described page buffer 231 may accurately sense a potential current level of the bit line Bit line in a program verify operation or a read operation. The sensing level of the bit line Bit line in the sensing operation may be changed depending on the potential levels of the first sense signal PB_SENSE, the first precharge signal SA_CSOC, and the second sense signal SA_SENSE. Therefore, in order to perform an accurate sensing operation, the first sense signal PB_SENSE, the first precharge signal SA_CSOC, and the second sense signal SA_SENSE are to be applied with constant potential levels.

Figure 7:
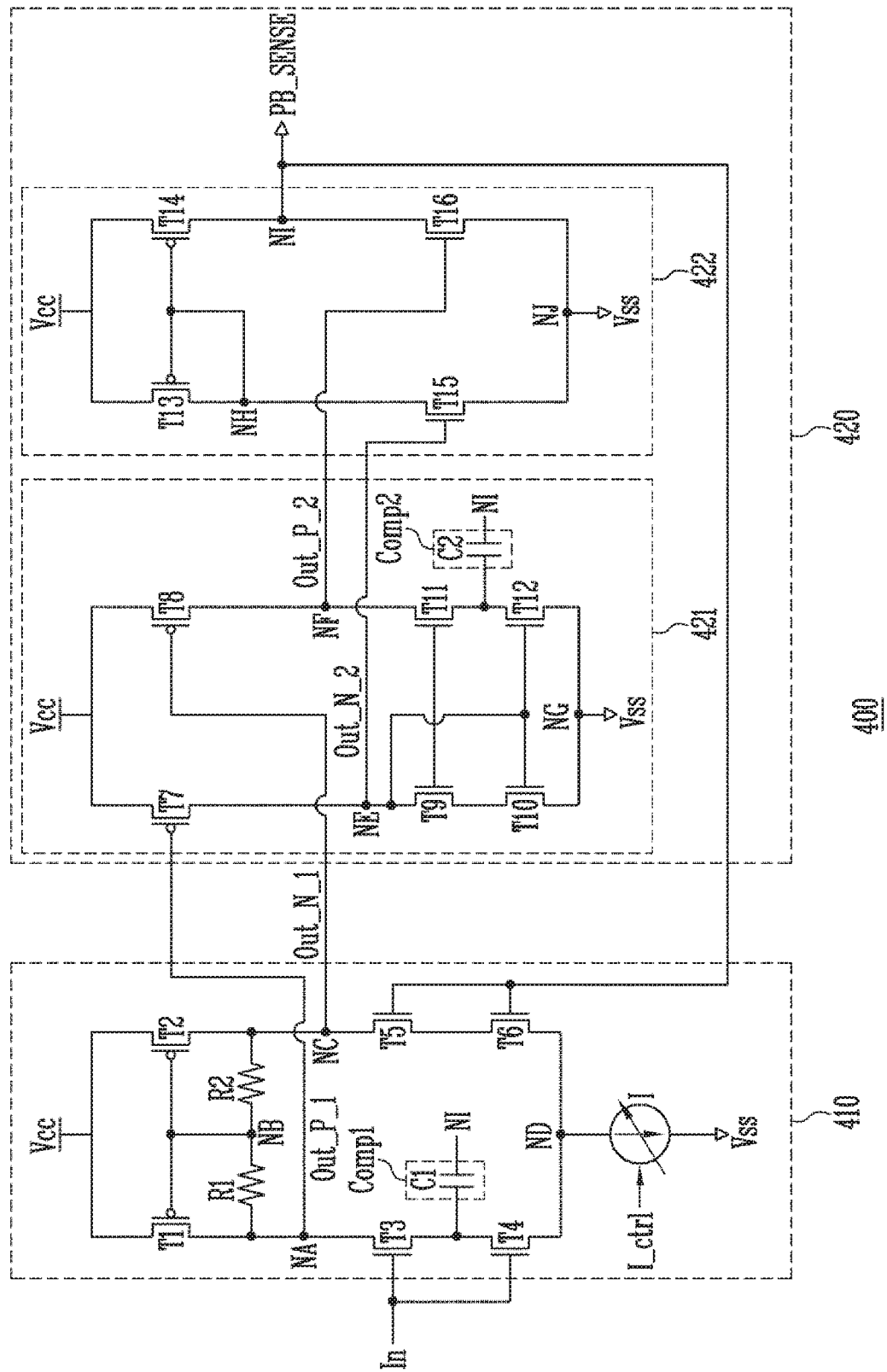
FIG. 7 is a diagram illustrating a signal generation circuit according to an embodiment of the present disclosure.

FIG. 7 is a diagram illustrating a signal generation circuit according to an embodiment of the present disclosure.

In the embodiment of the present disclosure, a signal generation circuit 400 for generating the first sense signal PB_SENSE among the first sense signal PB_SENSE, the first precharge signal SA_CSOC, and the second sense signal SA_SENSE, which are shown in FIG. 6, will be described as an example.

Referring to FIG. 7, the signal generation circuit 400 may include a signal input component 410 and a signal output component 420.

The signal input component 410 receives an input signal In, and generates and outputs a first internal output signal Out_P_1 and a second internal output signal Out_N_1 in response to the received input signal In.

The signal input component 410 may include first to sixth transistors T1 to T6, first and second resistors R1 and R2, a first compensator Comp1, and a variable current source I.

The first transistor T1 is coupled between a power voltage Vcc supplied to the signal generation circuit 400 and a node NA. The second transistor T2 is coupled between the power voltage Vcc and node NC. Gates of the first transistor T1 and the second transistor T2 are coupled to each other. The first resistor R1 is coupled between the node NA and a node NB coupled to the gates of the first and second transistors T1 and T2. The second resistor R2 is coupled between the node NC and the node NB. The first and second transistors T1 and T2 apply the power voltage Vcc to the node NA and the node NC according to a potential level of the node NB. The signal input component 410 increases loading impedance, using the first and second resistors R1 and R2, so that gains of the first internal output signal Out_P_1 and the second internal output signal Out_N_1 can be improved as compared with the input signal In.

The third transistor T3 and the fourth transistor T4 are coupled in series between the node NA and a node ND, and are controlled by the input signal In. The fifth transistor T5 and the sixth transistor T6 are coupled in series between the node NC and the node ND, and are controlled by a first sense signal PB_SENSE output from the signal output component 420.

The first compensator Comp1 is coupled between an output node NI of the signal output component 420 and a node between the third and fourth transistors T3 and T4, and adjusts a potential level of the node between the third and fourth transistors T3 and T4 according to a potential level of the output node NI. The first compensator Comp1 may be configured with a first capacitor C1. The first compensator Comp1 may compensate for a dominant pole of the signal input component 410.

The variable current source I is coupled between the node ND and a ground power voltage Vss, and adjusts an amount of current supplied in response to a current control signal I_ctrl.

The signal output component 420 generates and outputs the first sense signal PB_SENSE in response to the first internal output signal Out_P_1 and the second internal output signal Out_N_1, which are received from the signal input component 410.

The signal output component 420 may be configured in a superposition structure of an N-type differential amplifier and a P-type differential amplifier. The signal output component 420 includes a first output component 421 and second output component 422.

The first output component 421 generates and outputs a third internal output signal Out_N_2 and a fourth internal output signal Out_P_2 in response to the first internal output signal Out_P_1 and the second internal output signal Out_N_1.

The first output component 421 may include seventh to twelfth transistors T7 to T12 and a second compensator Comp2.

The seventh transistor T7 is coupled between the power voltage Vcc and a node NE, and is controlled by the first internal output signal Out_P_1. The eighth transistor T8 is coupled between the power voltage Vcc and a node NF, and is controlled by the second internal output signal Out_N_1. The ninth and tenth transistors T9 and T10 are coupled in series between the node NE and a node NG coupled to the ground power voltage Vss. The eleventh and twelfth transistors T11 and T12 are coupled in series between the node NF and the node NG. Gates of the ninth and eleventh transistors T9 and T11 are coupled to each other, and gates of the tenth and twelfth transistors T10 and T12 are coupled to the node NE.

The second compensator Comp2 is coupled between the output node NI of the signal output component 420 and a node between the eleventh and twelfth transistors T11 and T12, and adjusts a potential level of the node between the eleventh and twelfth transistors T11 and T12 according to the potential level of the output node NI. The first output component 421 may compensate for a dominant pole, using the second compensator Comp2.

The first output component 421 may adjust potential levels of the third internal output signal Out_N_2 and the fourth internal output signal Out_P_2 by adjusting an amount of current supplied from the power voltage Vcc by the first internal output signal Out_P_1 and the second internal output signal Out_N_1.

The second output component 422 generates and outputs the first sense signal PB_SENSE in response to the third internal output signal Out_N_2 and the fourth internal output signal Out_P_2.

The second output component 422 may include thirteenth to sixteenth transistors T13 to T16.

The thirteenth transistor T13 is coupled between the power voltage Vcc and a node NH, and is controlled by a potential level of the node NH. The fourteenth transistor T14 is coupled between the power voltage Vcc and the output node NI, and is controlled by the potential level of the node NH.

The fifteenth transistor T15 is coupled between the node NH and a node NJ that is coupled to the ground power voltage Vss, and is controlled by the third internal output signal Out_N_2. The sixteenth transistor T16 is coupled between the output node NI and the node NJ, and is controlled by the fourth internal output signal Out_P_2.

The signal generation circuit 400 of FIG. 7 may further include a current control signal generation circuit (described below) for generating the current control signal I_ctrl.

Figure 8:
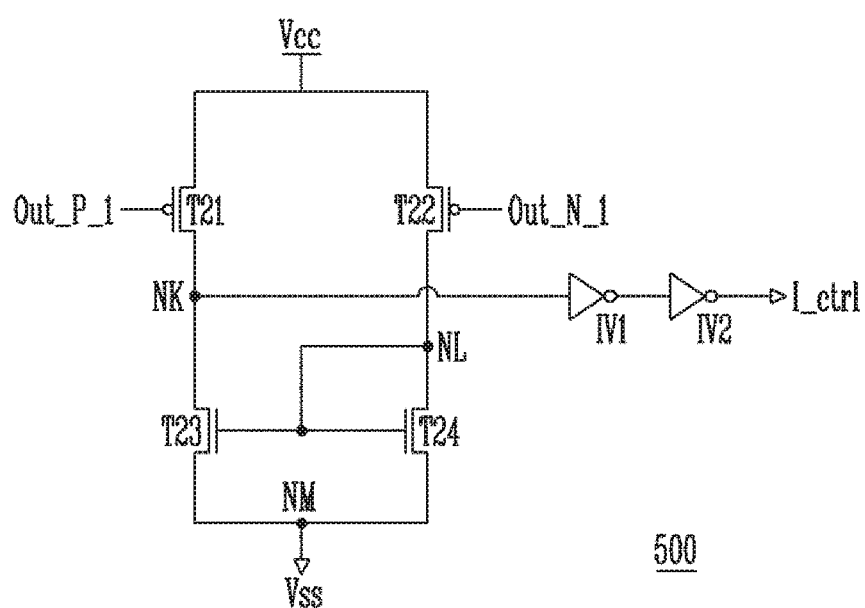
FIG. 8 is a diagram illustrating a current control signal generation circuit.

FIG. 8 is a diagram illustrating a current control signal generation circuit 500 according to an embodiment of the present disclosure.

Referring to FIG. 8, the current control signal generation circuit 500 generates the current control signal I_ctrl in response to the first internal output signal Out_P_1 and the second internal output signal Out_N_1, which are received from the signal input component 410 of FIG. 7.

The current control signal generation circuit 500 may include first to fourth transistors T21 to T24 and inverters IV1 and IV2.

The first transistor T21 is coupled between the power voltage Vcc and an output node NK, and is controlled by the first internal output signal Out_P_1. The second transistor T22 is coupled between the power voltage Vcc and a node NL, and is controlled by the second internal output signal Out_N_1.

The third transistor T23 is coupled between the output node NK and a node NM coupled to the ground power voltage Vss, and is controlled by a potential level of the node NL. The fourth transistor T24 is coupled between the node NL and the node NM, and is controlled by the potential level of the node NL.

The inverters IV1 and IV2 are coupled in series to the output node NK, and output the current control signal I_ctrl by buffering a potential level of the node NK.

The current control signal generation circuit 500 generates and outputs the current control signal I_ctrl having a high level when the first internal output signal Out_P_1 and the second internal output signal Out_N_1 are applied with a low level. Also, when the first internal output signal Out_P_1 and the second internal output signal Out_N_1 are increased to a certain level since the potential levels of the first internal output signal Out_P_1 and the second internal output signal Out_N_1 are unstable, the current control signal generation circuit 500 generates and outputs the current control signal I_ctrl having the high level by detecting the increase in the potential levels of the first internal output signal Out_P_1 and the second internal output signal Out_N_1.

Operations of the signal generation circuit 400 and the current control signal generation circuit 500 will be described as follows with reference to FIGS. 7 and 8.

When the input signal In is increased from the low level to the high level and then input, the third and fourth transistors T3 and T4 of the signal input component 410 are turned on. Thus, a potential level of the node NA is decreased. The signal input component 410 outputs the first internal output signal Out_P_1 decreased to the low level according to the potential level of the nod NA.

The seventh transistor T7 of the first output component 421 is turned on in response to the first internal output signal Out_P_1. Therefore, a potential level of the node NE is increased to the high level. The first output component 421 outputs the third internal output signal Out_N_2 increased to the high level according to the potential level of the node NE.

The fifteenth transistor T15 of the second output component 422 is turned on in response to the third internal output signal Out_N_2. Therefore, the potential level of the node NH is decreased, and hence the fourteenth transistor T14 is turned on, so that the potential level of the output node NI is increased. The second output component 422 outputs the first sense signal PB_SENSE having the high level according to the potential level of the output node NI.

The fifth and sixth transistors T5 and T6 of the signal input component 410 are turned on in response to the first sense signal PB_SENSE having the high level, and a potential level of the node NC is decreased. The signal input component 410 outputs the second internal output signal Out_N_1 decreased to the low level according to the potential level of the node NC.

The current control signal generation circuit 500 outputs the current control signal I_ctrl having a logic high level in response to the first internal output signal Out_P_1 having the low level and the second internal output signal Out_N_1 having the high level. The variable current source I may supply a first current in response to the current control signal I_ctrl having the logic high level.

The eighth transistor T8 of the first output component 421 is turned on in response to the second internal output signal Out_N_1. Therefore, a potential level of the node NF is increased to the high level. The first output component 421 outputs the fourth internal output signal Out_P_2 increased to the high level according to the potential level of the node NF.

The sixteenth transistor T16 of the second output component 422 is turned on in response to the fourth internal output signal Out_P_2. The output node NI continuously outputs the first sense signal PB_SENSE having a voltage level divided according to resistance values of the fourteenth transistor T14 and the sixteenth transistor T16.

When the power voltage Vcc is supplied with a certain level and then becomes unstable, an amount of current supplied to the signal generation circuit 400 is changed, and therefore, the potential level of the first sense signal PB_SENSE may be unstable. When the potential level of the first sense signal PB_SENSE is lower than a target potential level, the potential levels of the node NA and the node NC of the signal input component 410 may be increased from the low level. The current control signal generation circuit 500 outputs the current control signal I_ctrl having a logic low level in response to the first internal output signal Out_P_1 and the second internal output signal Out_N_1, which are increased to a certain potential level. The variable current source I supplies a second current having an amount smaller than that of the first current in response to the current control signal I_ctrl having the logic low level. Thus, the potential levels of the node NA and the node NC of the signal input component 410 can be rapidly stabilized to the low level.

In addition, the first compensator Comp1 and the second compensator Comp2 may compensate for dominant poles, using in-direct compensation, according to the potential level of the output node NI.

Although the signal generation circuit 400 generates the first sense signal PB_SENSE shown in FIG. 6, the signal generation circuit 400 may generate the first precharge signal SA_CSOC and the second sense signal SA_SENSE, which are to be applied with a constant potential level even though the power voltage is fluctuated in the sensing operation of the bit line.

By using a respective instance of the signal generating circuit 400, the first sense signal PB_SENSE, the first precharge signal SA_CSOC, and the second sense signal SA_SENSE are stably generated and output. Thus, the page buffer 231 of FIG. 6 can accurately sense a potential current level of the bit line Bit line in the program verify operation and the read operation.

Figure 9:
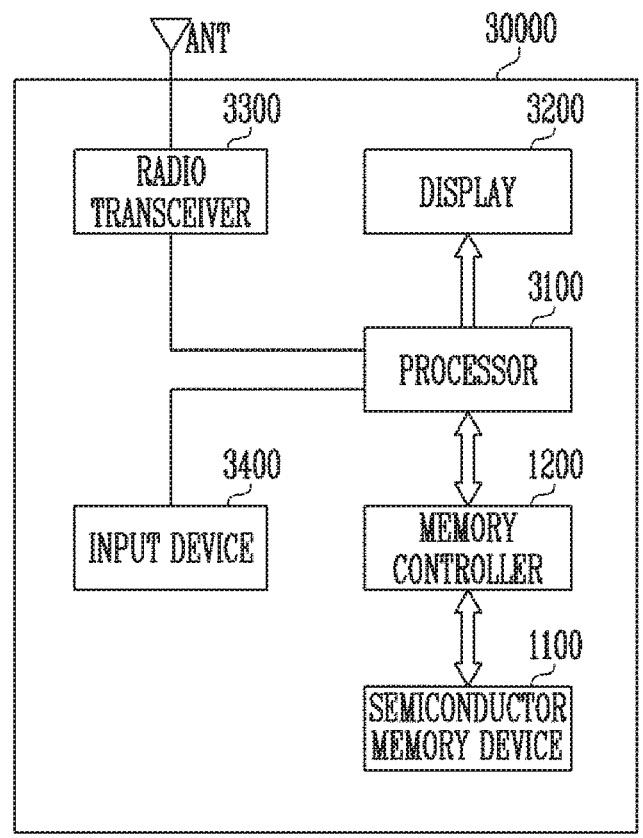
FIG. 9 is a diagram illustrating an embodiment of a memory system including a memory device according to an embodiment of the present disclosure.

FIG. 9 is a diagram illustrating an embodiment of a memory system according to an embodiment of the present disclosure, for example, a memory system 30000 including the semiconductor memory device 1100 shown in FIG. 2.

Referring to FIG. 9, the memory system 30000 may be implemented as a cellular phone, a smart phone, a tablet PC, a personal digital assistant (PDA), or a wireless communication device. The memory system 30000 may include the semiconductor memory device 1100 and a memory controller 1200 capable of controlling an operation of the semiconductor memory device 1100. The memory controller 1200 may control a data access operation of the semiconductor memory device 1100, e.g., a program operation, an erase operation, a read operation, or the like under the control of a processor 3100.

Data programmed in the semiconductor memory device 1100 may be output through a display 3200 under the control of the memory controller 1200.

A radio transceiver 3300 may transmit and/or receive radio signals through an antenna ANT. For example, the radio transceiver 3300 may convert a radio signal received through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may transmit the signal processed by the processor 3100 to the semiconductor memory device 1100. Also, the radio transceiver 3300 may convert a signal output from the processor 3100 into a radio signal, and output the converted radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the semiconductor memory device 1100 may be implemented as a part of the processor 3100, or be implemented as a chip separate from the processor 3100.

Figure 10:
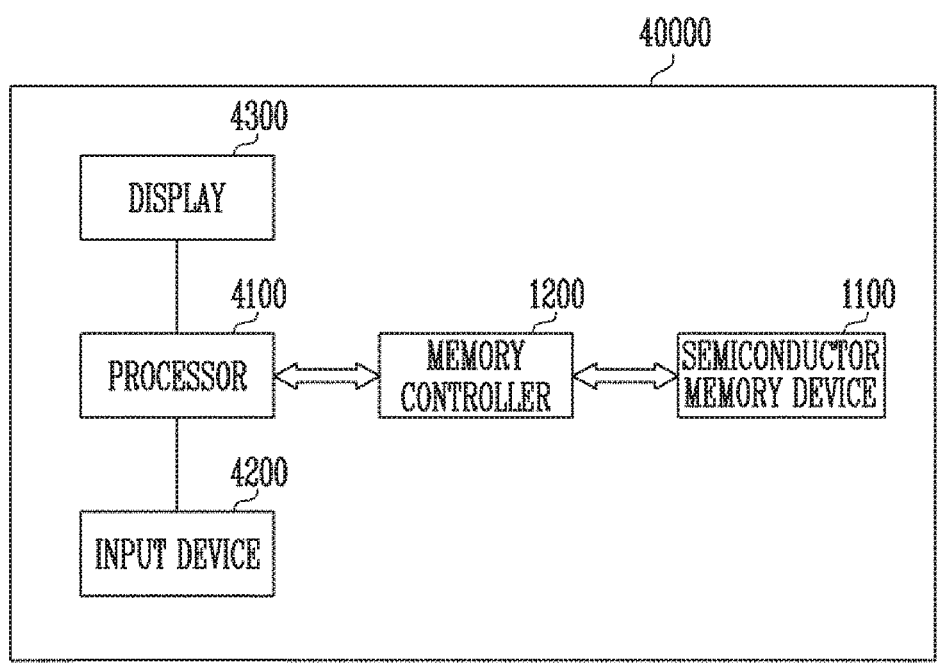
FIG. 10 is a diagram illustrating an embodiment of a memory system including a memory device according to an embodiment of the present disclosure.

FIG. 10 is a diagram illustrating an embodiment of a memory system according to an embodiment of the present disclosure, for example, a memory system 40000 including the semiconductor memory device 1100 shown in FIG. 2.

Referring to FIG. 10, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include the semiconductor memory device 1100 and a memory controller 1200 capable of controlling a data processing operation of the semiconductor memory device 1100.

A processor 4100 may output data stored in the semiconductor memory device 1100 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 1200. In some embodiments, the memory controller 1200 capable of controlling an operation of the semiconductor memory device 1100 may be implemented as a part of the processor 4100, or be implemented as a chip separate from the processor 4100.

Figure 11:
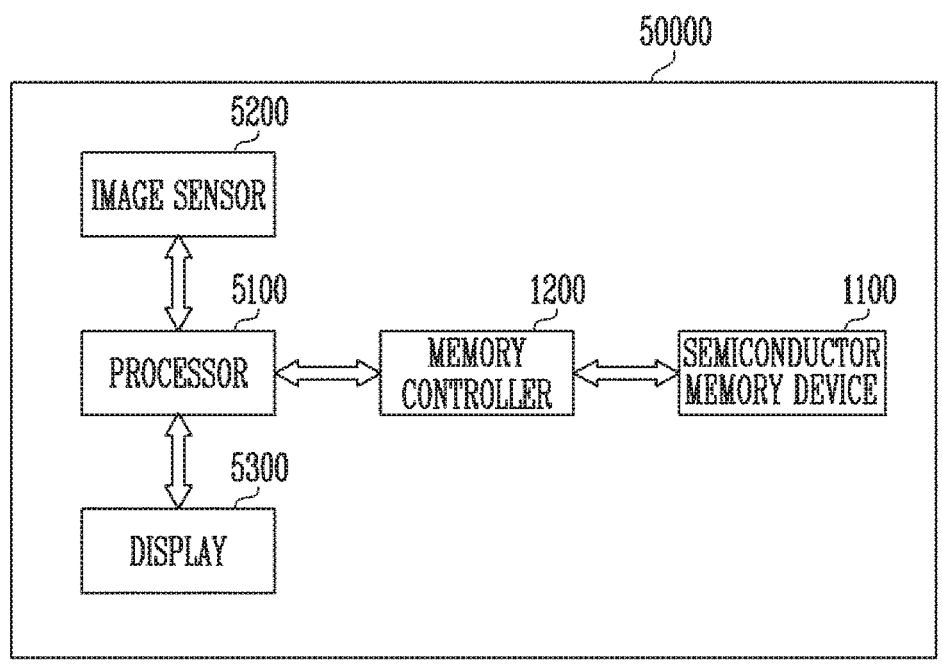
FIG. 11 is a diagram illustrating an embodiment of a memory system including a memory device according to an embodiment of the present disclosure.

FIG. 11 is a diagram illustrating an embodiment of a memory system according to an embodiment of the present disclosure, for example, a memory system 50000 including the semiconductor memory device 1100 shown in FIG. 2.

Referring to FIG. 11, the memory system 50000 may be implemented as an image processing device, e.g., a digital camera, a mobile terminal having a digital camera attached thereto, a smart phone having a digital camera attached thereto, or a tablet personal computer (PC) having a digital camera attached thereto.

The memory system 50000 may include the semiconductor memory device 1100 and a memory controller 1200 capable of controlling a data processing operation of the semiconductor memory device 1100, e.g., a program operation, an erase operation, or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output through a display 5300, or be stored in the semiconductor memory device 1100 through the memory controller 1200. In addition, data stored in the semiconductor memory device 1100 may be output through the display 5300 under the control of the processor 5100 or the memory controller 1200.

In some embodiments, the memory controller 1200 capable of controlling an operation of the semiconductor memory device 1100 may be implemented as a part of the processor 5100, or be implemented as a chip separate from the processor 5100.

Figure 12:
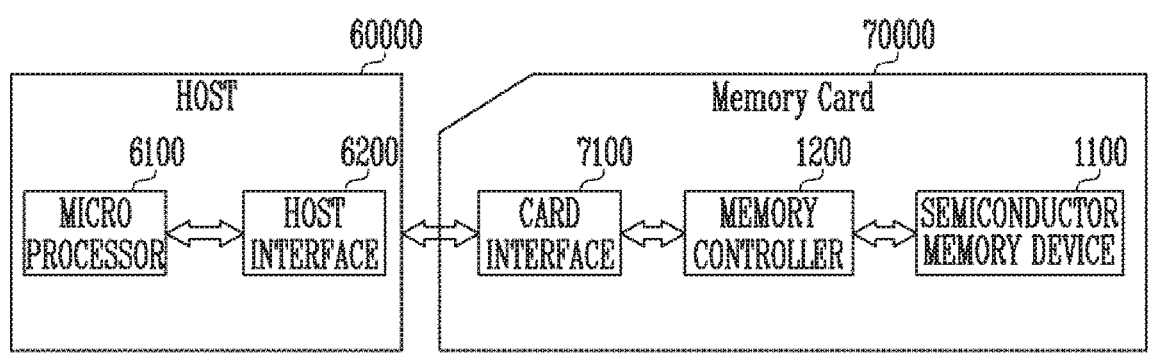
FIG. 12 is a diagram illustrating an embodiment of a memory system including a memory device according to an embodiment of the present disclosure.

FIG. 12 is a diagram illustrating an embodiment of a memory system according to an embodiment of the present disclosure, for example, a memory system 70000 including the semiconductor memory device 1100 shown in FIG. 2.

Referring to FIG. 12, the memory system 70000 may be implemented as a memory card or a smart card. The memory system 70000 may include the semiconductor memory device 1100, a memory controller 1200, and a card interface 7100.

The memory controller 1200 may control data exchange between the semiconductor memory device 1100 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the memory controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is coupled to a host interface 6200 of the host 60000 such as a personal computer (PC), a tablet PC, a digital camera, a digital audio player, a cellular phone, console video game hardware, or a digital set-top box, the host interface 6200 may perform data communication with the semiconductor memory device 1100 through the card interface 7100 and the memory controller 1200 under the control of a microprocessor 6100.

According to the present disclosure, although the power voltage supplied to the signal generation circuit is unstable, the signal generation circuit can output an output signal by stably controlling the potential level of the output signal.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A signal generation circuit comprising:
    a signal input component configured to generate a first internal output signal and a second internal output signal in response to an input signal, and to adjust potential levels of the first internal output signal and the second internal output signal in response to an output signal;
    a signal output component configured to generate the output signal in response to the first internal output signal and the second internal output signal;
    a variable current source coupled between a third node and a ground voltage, configured to adjust an amount of current supplied in response to a current control signal; and
    a current control signal generation circuit configured to generate the current control signal in response to the first internal output signal and the second internal output signal,
    wherein the signal input component includes:
    a first transistor coupled between a power voltage and a first node;
    a second transistor coupled between the power voltage and a second node;
    third and fourth transistors coupled in series between the first node and the third node, the third and fourth transistors being controlled by the input signal; and
    fifth and sixth transistors coupled in series between the second node and the third node, the fifth and sixth transistors being controlled by the output signal.

2. The signal generation circuit of claim 1, further comprising:
    a first resistor coupled between the first node and a gate of the first transistor; and
    a second resistor coupled between the second node and a gate of the second transistor.

3. The signal generation circuit of claim 1, further comprising a first compensator coupled between an output node of the signal output component and a node between the third transistor and the fourth transistor,
    wherein the first compensator adjusts a potential level of the node between the third transistor and the fourth transistor according to a potential level of the output signal.

4. The signal generation circuit of claim 1, wherein the variable current source supplies a first current to the third node when the output signal is output with a target potential level, and supplies a second current larger than the first current to the third node when the output signal is output lower than the target potential level.

5. The signal generation circuit of claim 1, wherein the signal output component includes:
    a first output component configured to generate a third internal output signal and a fourth internal output signal in response to the first internal output signal and the second internal output signal; and
    a second output component configured to generate the output signal in response to the third internal output signal and the fourth internal output signal.

6. The signal generation circuit of claim 5, wherein the first output component includes;
    a seventh transistor coupled between a power voltage and a fourth node, the seventh transistor being controlled by the first internal output signal;
    an eighth transistor coupled between the power voltage and a fifth node, the eighth transistor being controlled by the second internal output signal;
    ninth and tenth transistors coupled in series between the fourth node and a sixth node; and
    eleventh and twelfth transistors coupled in series between the fifth node and the sixth node,
    wherein the first output component outputs a potential level of the fourth node as the third internal output signal, and outputs a potential level of the fifth node as the fourth internal output signal.

7. The signal generation circuit of claim 6, wherein the first output component further includes a second compensator coupled between an output node of the second output component and a node between the eleventh transistor and the twelfth transistor,
    wherein the second compensator adjusts a potential level of the node between the eleventh transistor and the twelfth transistor according to the potential level of the output signal.

8. A semiconductor memory device comprising:
    a memory cell array including a plurality of memory cells;
    a page buffer group coupled to a plurality of bit lines of the memory cell array, configured to sense potential levels or current levels of the plurality of bit lines in response to a sensing signal in a program verify operation and a read operation on the memory cell array; and
    a signal generation circuit configured to generate the sensing signal in the program verify operation and the read operation,
    wherein the signal generation circuit includes:
    a signal input component configured to generate a first internal output signal and a second internal output signal in response to an input signal, and to adjust potential levels of the first internal output signal and the second internal output signal in response to the sensing signal; and a signal output component configured to generate the sensing signal in response to the first internal output signal and the second internal output signal.

9. The semiconductor memory device of claim 8, wherein the signal input component includes:

first transistor coupled between a power voltage and first node;

second transistor coupled between the power voltage and second node;

third and fourth transistors coupled in series between the first node and a third node, the third and fourth transistors being controlled by the input signal; and fifth and sixth transistors coupled in series between the second node and the third node, the fifth and sixth transistors being controlled by the sensing signal.

10. The semiconductor memory device of claim 9, further comprising:

a first resistor coupled between the first node and a gate of the first transistor; and a second resistor coupled between the second node and a gate of the second transistor.

11. The semiconductor memory device of claim 9, further comprising a first compensator coupled between an output node of the signal output component and a node between the third transistor and the fourth transistor, wherein the first compensator adjusts a potential level of the node between the third transistor and the fourth transistor according to a potential level of the sensing signal.

12. The semiconductor memory device of claim 9, further comprising a variable current source coupled between the third node and a ground voltage, wherein the variable current source adjusts an amount of current supplied in response to a current control signal.

13. The semiconductor memory device of claim 12, wherein the signal generation circuit further includes a current control signal generation circuit configured to generate the current control signal in response to the first internal output signal and the second internal output signal.

14. The semiconductor memory device of claim 12, wherein the variable current source supplies a first current to the third node when the sensing signal is output with a target potential level, and supplies a second current larger than the first current to the third node when the sensing signal is output lower than the target potential level.

15. The semiconductor memory device of claim 8, wherein the signal output component includes:

a first output component configured to generate a third internal output signal and a fourth internal output signal in response to the first internal output signal and the second internal output signal; and a second output component configured to generate the sensing signal in response to the third internal output signal and the fourth internal output signal.

16. The semiconductor memory device of claim 15, wherein the first output component includes;

a seventh transistor coupled between a power voltage and a fourth node, the seventh transistor being controlled by the first internal output signal;

an eighth transistor coupled between the power voltage and a fifth node, the eighth transistor being controlled by the second internal output signal;

ninth and tenth transistors coupled in series between the fourth node and a sixth node; and eleventh and twelfth transistors coupled in series between the fifth node and the sixth node, wherein the first output component outputs a potential level of the fourth node as the third internal output signal, and outputs a potential level of the fifth node as the fourth internal output signal.

17. The semiconductor memory device of claim 16, wherein the first output component further includes a second compensator coupled between an output node of the second output component and a node between the eleventh transistor and the twelfth transistor, wherein the second compensator adjusts a potential level of the node between the eleventh transistor and the twelfth transistor according to the potential level of the sensing signal.

18. A signal generation circuit comprising:

a signal input component configured to generate a first internal output signal and a second internal output signal in response to an input signal, and to adjust potential levels of the first internal output signal and the second internal output signal in response to an output signal; and a signal output component configured to generate the output signal in response to the first internal output signal and the second internal output signal, wherein the signal input component includes:

a first transistor coupled between a power voltage and a first node;

a second transistor coupled between the power voltage and a second node;

a first resistor coupled between the first node and a gate of the first transistor; and a second resistor coupled between the second node and a gate of the second transistor.

19. The signal generation circuit of claim 18, further comprising:

third and fourth transistors coupled in series between the first node and a third node, the third and fourth transistors being controlled by the input signal;

fifth and sixth transistors coupled in series between the second node and the third node, the fifth and sixth transistors being controlled by the output signal; and a first compensator coupled between an output node of the signal output component and a node between the third transistor and the fourth transistor, wherein the first compensator adjusts a potential level of the node between the third transistor and the fourth transistor according to a potential level of the output signal.

* * * * *